(12) United States Patent
Anthony

(10) Patent No.: US 6,900,491 B2
(45) Date of Patent: May 31, 2005

(54) MAGNETIC MEMORY

(75) Inventor: Thomas C. Anthony, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/679,564

(22) Filed: Oct. 6, 2003

(65) Prior Publication Data

US 2005/0072995 A1 Apr. 7, 2005

(51) Int. Cl.[7] ............................................. H01L 31/119
(52) U.S. Cl. ................................................... 257/295
(58) Field of Search ......................... 257/295, 30, 294, 257/421, 422, 390, 340, 652

(56) References Cited

U.S. PATENT DOCUMENTS

| | | | |
|---|---|---|---|
| 5,039,655 A | 8/1991 | Pisharody | |
| 5,861,328 A | 1/1999 | Tehrani et al. | |
| 5,956,267 A | 9/1999 | Hurst et al. | |
| 6,153,443 A | 11/2000 | Durlam et al. | |
| 6,169,686 B1 | 1/2001 | Brug et al. | |
| 6,261,893 B1 | 7/2001 | Chang et al. | |
| 6,417,561 B1 | 7/2002 | Tuttle | |
| 6,548,849 B1 * | 4/2003 | Pan et al. | 257/296 |
| 6,551,852 B2 | 4/2003 | Tuttle | |
| 6,555,858 B1 | 4/2003 | Jones et al. | |
| 6,716,644 B2 * | 4/2004 | Nejad et al. | 438/3 |
| 2004/0087163 A1 * | 5/2004 | Steimle et al. | 438/694 |

* cited by examiner

*Primary Examiner*—David Nelms
*Assistant Examiner*—Thinh T Nguyen

(57) ABSTRACT

Embodiments of the present invention provide a magnetic memory. In one embodiment, the magnetic memory comprises an insulator having a trench, a first conductor in the trench, a first magnetic layer in the trench and adjacent to the first conductor, and a second magnetic layer outside the trench.

23 Claims, 8 Drawing Sheets

MAGNETIC MEMORY

BACKGROUND OF THE INVENTION

Electronic systems use solid-state memory devices to store data, such as application programs, operating systems and real-time input and output information. The electronic systems, such as computers, computer system components and digital processing systems are built within space and budget constraints. The electronic systems often use more storage capacity as they become more complex. To meet the ever increasing demand for storage capacity and to stay within system space and budget constraints, memory device suppliers endeavor to increase memory cell density in the memory devices.

One type of solid-state memory device known in the art includes magnetic memory cells. These devices, known as magnetic random access memory (MRAM) devices are non-volatile, reprogrammable devices that include an array of magnetic memory cells. The magnetic memory cells may be of different types. For example, the memory cells can be magnetic tunnel junction (MTJ) memory cells or giant magneto-resistive (GMR) memory cells.

Generally, a magnetic memory cell includes a layer of magnetic film in which the orientation of magnetization is alterable and a layer of magnetic film in which the orientation of magnetization may be fixed or "pinned" in a particular direction. The magnetic film having alterable magnetization is referred to as a sense layer or data storage layer, and the magnetic film that is fixed is referred to as a reference layer or pinned layer. In an MTJ memory cell, an insulating barrier layer separates the sense layer and the reference layer.

Conductive traces referred to as word lines and bit lines are routed across the array of memory cells. Word lines extend along rows of the memory cells, and bit lines extend along columns of the memory cells. A bit of information is stored in a memory cell as an orientation of magnetization in the sense layer at the intersection of a word line and a bit line. The orientation of magnetization in the sense layer aligns along an axis of the sense layer referred to as its easy axis. Magnetic fields are applied to flip the orientation of magnetization in the sense layer along its easy axis to either a parallel or anti-parallel orientation with respect to the orientation of magnetization in the reference layer.

The resistance through a memory cell differs according to the parallel or anti-parallel orientation of magnetization of the sense layer relative to the reference layer. The resistance is highest when the orientation is anti-parallel, which can be referred to as a logic "1" state, and lowest when the orientation is parallel, which can be referred to as a logic "0" state. The resistive state of the memory cell can be determined by sensing the resistance through the memory cell.

Magnetic memory cells are formed using pattern masks to fabricate the magnetic memory cell layers. Forming a high-density magnetic memory cell array can be very difficult in sub-micron magnetic memory devices. Alignment of the pattern masks is critical for achieving small memory cell sizes. The magnetic memory suppliers strive to improve fabrication and alignment techniques to form smaller magnetic memory cells and more densely packed magnetic memory cell arrays. In addition, magnetic memory suppliers make every effort to reduce fabrication complexity while forming smaller magnetic memory cells and less expensive magnetic memory cell arrays.

SUMMARY OF THE INVENTION

Embodiments of the present invention provide a magnetic memory. In one embodiment, the magnetic memory comprises an insulator having a trench, a first conductor in the trench, a first magnetic layer in the trench and adjacent to the first conductor, and a second magnetic layer outside the trench.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
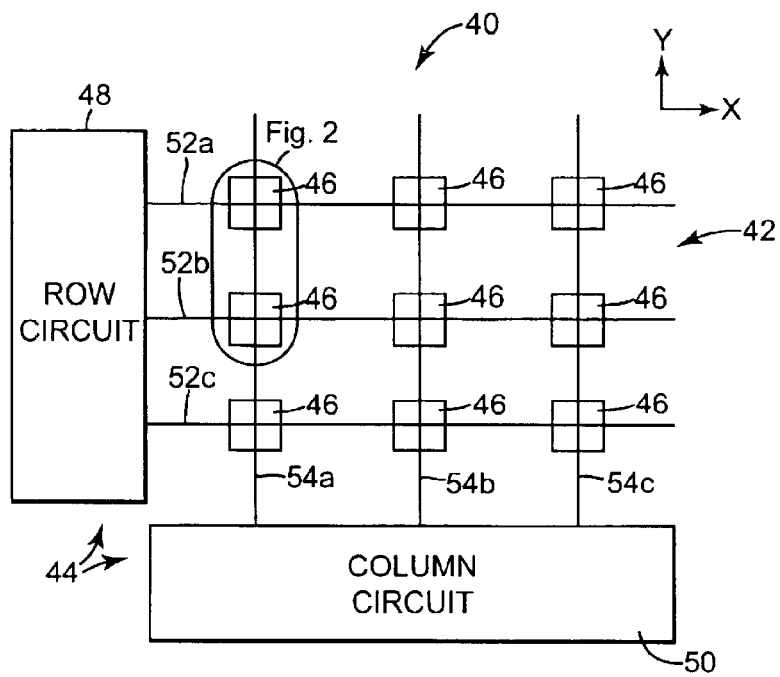
FIG. 1 is a diagram illustrating an exemplary embodiment of a magnetic memory, according to the present invention.

FIG. 1 is a diagram illustrating an exemplary embodiment of a magnetic memory 40, according to the present invention. The memory 40 includes a magnetic memory cell array 42 and a read/write circuit, indicated at 44. The memory cell array 42 is coupled to the read/write circuit 44 that includes a read circuit and a write circuit. The array 42 includes magnetic memory cells 46.

The magnetic memory cells 46 include a magnetic layer aligned with a conductor in a dielectric trench. The array 42 and memory cells 46 are formed using a damascene process. Trenches are formed in a dielectric layer and conductors are formed in the trenches. In addition, one of the magnetic layers of the memory cells 46 is formed in the trenches, next to the conductors. The trenches self-align at least one dimension of the magnetic layer with the trench conductors. In one embodiment, the trenches self-align reference layers along the length and width of the trench conductors. In another embodiment, the trenches self-align sense layers along the width of the trench conductors. Self-aligning one of the magnetic layers of the memory cells 46 with the trench conductors eliminates a pattern mask and the alignment tolerances or error associated with the pattern mask. Thus, smaller memory cells 46 can be produced. The smaller memory cells 46 can be more densely packed in array 42.

The memory cells 46 in array 42 are arranged in rows and columns, with the rows extending along an x-direction and the columns extending along a y-direction. Only a relatively small number of memory cells 46 are shown to simplify the illustration of magnetic memory 40. In practice, arrays of any suitable size can be used and the arrays can be stacked to form three-dimensional macro-array structures that operate in highly parallel modes.

In one suitable addressing scheme for a macro-array, memory cells are accessed by selecting one word line in each of a plurality of arrays and by selecting multiple bit lines in each of the plurality of arrays. Selecting multiple bit lines in each array, selects multiple memory cells from each array. The accessed memory cells within each of the plurality of arrays correspond to a small portion of a unit of data. Together the accessed memory cells provide a whole unit of data, such as a sector of 512 bytes or at least a substantial portion of a whole unit of data. The memory cells are accessed substantially simultaneously.

In the exemplary embodiment, the read/write circuit 44 includes read/write row circuit 48, and read/write column circuit 50. The row circuit 48 is electrically coupled to word lines 52a–52c, and the column circuit 50 is electrically coupled to bit lines 54a–54c. The conductive word lines 52a–52c extend along the x-direction in a plane on one side of array 42. The conductive bit lines 54a–54c extend along the y-direction in a plane on an opposing side of array 42. There is one word line 52a–52c for each row of the array 42, and one bit line 54a–54c for each column of the array 42. A memory cell 46 is located at each cross-point of a word line 52a–52c and a bit line 54a–54c.

During a write operation, the read/write circuit 44 selects one word line 52a–52c and one bit line 54a–54c to set or switch the orientation of magnetization in the sense layer of the memory cell 46 located at the cross-point of the selected word line 52a–52c and bit line 54a–54c. The row circuit 48 selects one word line 52a–52c, and the column circuit 50 selects one bit line 54a–54c. The row circuit 48 provides a word write current in either direction through the selected word line 52a–52c from/to another portion of the row circuit 48 not shown in the illustration. The column circuit 50 provides a bit write current in either direction through the selected bit line 54a–54c from/to another portion of the column circuit 50 not shown in the illustration. The word and bit write currents create magnetic fields, according to the right hand rule, around the selected word line 52a–52c and the selected bit line 54a–54c, and in the selected memory cell 46. These magnetic fields combine to set or switch the state of the selected memory cell 46.

During a read operation, the read/write circuit 44 selects one word line 52a–52c and one bit line 54a–54c to sense the resistance through the memory cell 46 located at the cross-point of the selected word line 52a–52c and the selected bit line 54a–54c. The row circuit 48 selects one word line 52a–52c, and the column circuit 50 selects one bit line 54a–54c. The read/write circuit 44 is configured to sense the resistance through a selected memory cell 46 and provide a logic level output corresponding to the resistive state of the selected memory cell 46. In the exemplary embodiment, the row circuit 48 provides a voltage on the selected word line 52a–52c and a sense current through the selected word line 52a–52c and memory cell 46 to the selected bit line 54a–54c. The column circuit 50 senses the magnitude of the sense current that indicates the resistive state of the selected memory cell 46. The read/write circuit 44 provides a logic level output signal to indicate the resistive state of the selected memory cell 46.

In the exemplary embodiment, the word lines 52a–52c and bit lines 54a–54c are used for reading and writing. In another embodiment, a third set of conductors can be added to read and write using different sets of conductors. For example, a write operation can be performed using word lines 52a–52c and bit lines 54a–54c, and a read operation can be performed using the third set of conductors and bit lines 54a–54c. The word lines 52a–52c are insulated from the memory cells.

Figure 2:
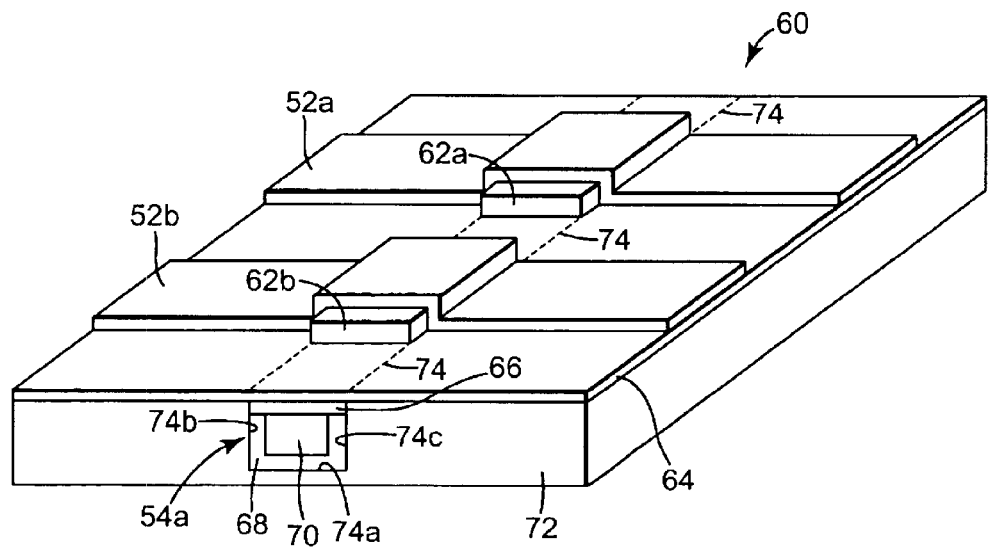
FIG. 2 is a diagram illustrating an exemplary embodiment of an array section.

FIG. 2 is a diagram illustrating an exemplary embodiment of an array section, indicated at 60. Array section 60 includes word lines 52a and 52b, sense layers 62a and 62b, barrier layer 64, reference layer 66 and bit line 54a. The bit line 54a includes a ferromagnetic cladding layer 68 and a conductor 70. In the exemplary embodiment, word lines 52a and 52b are orthogonal to bit line 54a. In other embodiments, word lines 52a and 52b can lie in other suitable angular relationships with bit line 54a. In addition, in other embodiments, bit line 54a can be built without ferromagnetic cladding layer 68.

The bit line 54a and reference layer 66 are disposed in a dielectric layer 72. The bit line 54a and reference layer 66 are formed in a damascene trench, indicated at 74, in dielectric layer 72. The trench 74 includes three side surfaces 74a–74c, and extends the length of dielectric layer 72. The trench 74 is lined on one side surface 74a and partially lined on two side surfaces 74b and 74c with ferromagnetic cladding layer 68. The ferromagnetic cladding layer 68 includes magnetic material with a higher permeability than conductor 70. The conductor 70 is a conductor, such as copper, disposed inside cladding layer 68. The reference layer 66 is disposed on cladding layer 68 and conductor 70. The reference layer 66 and bit line 54a extend the length of dielectric layer 72 in trench 74 and cross sense layers 62a and 62b. The reference layer 66 has a pinned orientation of magnetization.

The barrier layer 64 is a planar blanket layer disposed on dielectric layer 72 and reference layer 66, outside the trench 74. The barrier layer 64 is located between reference layer 66 and sense layers 62a and 62b. In the exemplary embodiment, barrier layer 64 is an insulator through which an electrical charge tunnels during read operations. Electrical charge tunneling occurs in response to a voltage across a selected word line 52a and 52b and the bit line 54a.

The sense layers 62a and 62b are formed on the planar barrier layer 64. The sense layers 62a and 62b are aligned with reference layer 66 along the length of trench 74 and insulated from reference layer 66 by barrier layer 64. The sense layers 62a and 62b have an alterable orientation of magnetization. A memory cell 46 comprises reference layer 66, barrier layer 64 and one of the sense layers 62a and 62b.

The word lines 52a and 52b are conductors formed on barrier layer 64 and sense layers 62a and 62b. The word lines 52a and 52b are patterned to be narrower than sense layers 62a and 62b along the length dimension into the page and parallel to trench 74. The word lines 52a and 52b are insulated from reference layer 66 by barrier layer 64 and dielectric layer 72. The word lines 52a and 52b and bit line 54a are electrically coupled to read/write circuit 44.

During a write operation, read/write circuit 44 selects bit line 54a and one of the word lines 52a and 52b to write the memory cell 46 located at the cross-point of the bit line 54a and the selected word line 52a and 52b. Read/write circuit 44 provides word and bit write currents through the selected word line 52a and 52b, and bit line 54a. The write currents create magnetic fields around the selected word line 52a and 52b and bit line 54a, according to the right hand rule. The ferromagnetic cladding layer 68 localizes the magnetic field around bit line 54a to magnify the magnetic field in the selected sense layer 62a and 62b. The magnetic fields combine to set or switch the orientation of magnetization in the selected sense layer 62a and 62b.

During a read operation, read/write circuit 44 selects bit line 54a and one of the word lines 52a and 52b to sense the resistance through the memory cell 46 located at the cross-point of the bit line 54a and the selected word line 52a and 52b. The column circuit 50 selects bit line 54a, and the row circuit 48 selects one of the word lines 52a and 52b. The row circuit 48 provides a voltage on the selected word line 52a and 52b and a sense current through the selected word line 52a and 52b, the selected sense layer 62a and 62b, barrier layer 64 and reference layer 66 to bit line 54a The column circuit 50 senses the magnitude of the sense current that indicates the resistive state of the selected memory cell 46. The read/write circuit 44 provides a logic level output signal to indicate the resistive state of the selected memory cell 46.

Figure 3:
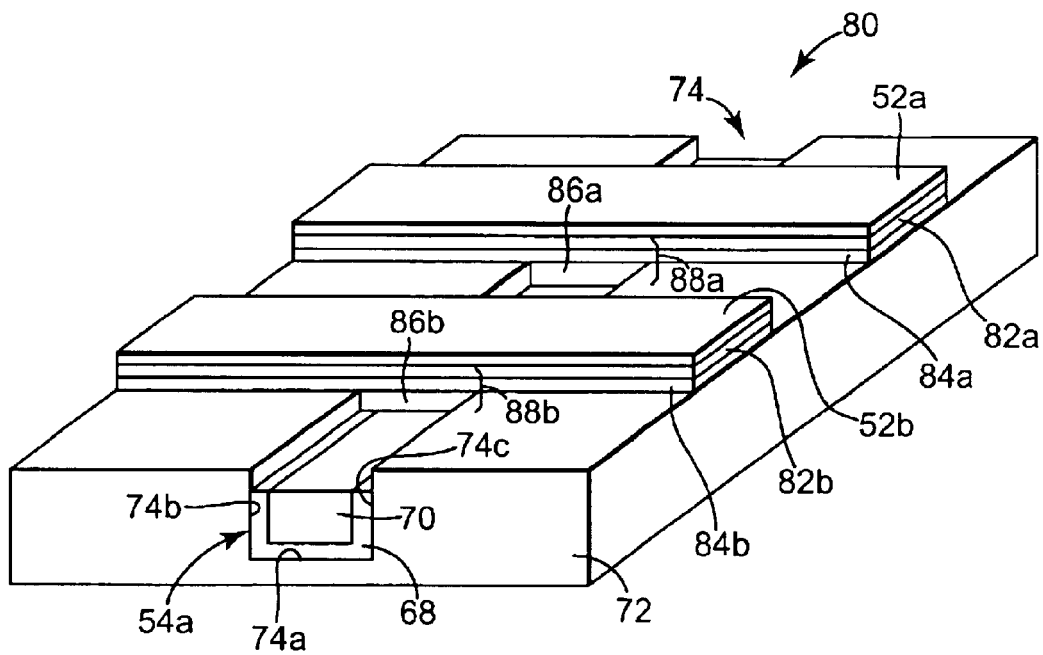
FIG. 3 is a diagram illustrating another embodiment of an array section.

FIG. 3 is a diagram illustrating another embodiment of an array section, indicated at 80. Array section 80 includes word lines 52a and 52b, reference layers 82a and 82b, barrier layers 84a and 84b, sense layers 86a and 86b, and bit line 54a. The bit line 54a includes ferromagnetic cladding layer 68 and conductor 70. The word lines 52a and 52b are orthogonal to bit line 54a. In other embodiments, the word lines 52a and 52b can lie in other suitable angular relationships with bit line 54a.

The bit line 54a and sense layers 86a and 86b are formed in dielectric layer 72. The bit line 54a and sense layers 86a and 86b are formed in damascene trench 74 in dielectric layer 72. The damascene trench 74 includes three side surfaces 74a–74c and extends the length of dielectric layer 72. The trench 74 is lined on one side surface 74a and partially lined on two side surfaces 74b and 74c with cladding layer 68. The cladding layer 68 includes magnetic material with a higher permeability than conductor 70. The conductor 70 is a conductor, such as copper, that is disposed in cladding layer 68. The sense layers 86a and 86b are disposed in the damascene trench 74 and patterned into oblong or rectangular patterns under word lines 52a and 52b. The widths of sense layers 86a and 86b are defined by the two opposing side surfaces 74b and 74c of trench 74. The sense layers 86a and 86b have an alterable orientation of magnetization.

The barrier layers 84a and 84b are disposed in a plane on dielectric layer 72 and sense layers 86a and 86b, outside the trench 74. The barrier layers 84a and 84b are located between sense layers 86a and 86b and reference layers 82a and 82b. The barrier layer 84a is located between sense layer 86a and reference layer 82a, and barrier layer 84b is located between sense layer 86b and reference layer 82b. The barrier layers 84a and 84b are insulators through which an electrical charge tunnels during a read operation. Electrical charge tunneling occurs in response to a voltage across a selected word line 52a and 52b, and bit line 54a.

The reference layers 82a and 82b are disposed in a plane on barrier layers 84a and 84b. The reference layers 82a and 82b are aligned to cross sense layers 86a and 86b and are insulated from sense layers 86a and 86b by barrier layers 84a and 84b. One memory cell 46 comprises sense layer 86a, barrier layer 84a and reference layer 82a in a memory cell stack, indicated at 88a. A second memory cell 46 comprises sense layer 86b, barrier layer 84b and reference layer 82b in a second memory cell stack 88b. The memory cell stack 88a is located between word line 52a and bit line 54a, and the memory cell stack 88b is located between word line 52b and bit line 54a. Each of the reference layers 82a and 82b cross multiple memory cells 46.

The word lines 52a and 52b are conductors disposed in a plane on the reference layers 82a and 82b. Word line 52a is located next to reference layer 82a, and word line 52b is located next to reference layer 82b. The word line 52a, reference layer 82a and barrier layer 84a are similarly patterned to cross sense layer 86a The word line 52b, reference layer 82b and barrier layer 84b are similarly patterned to cross sense layer 86b. The word lines 52a and 52b and the bit line 54a are electrically coupled to read/Write circuit 44.

During a write operation, read/write circuit 44 selects bit line 54a and one of the word lines 52a and 52b to write the memory cell 46 located at the cross-point of bit line 54a and the selected word line 52a and 52b. Read/write circuit 44 provides word and bit write currents through the selected word line 52a and 52b and bit line 54a The write currents create magnetic fields around the selected word line 52a and 52b and bit line 54a, according to the right hand rule. The cladding layer 68 localizes the magnetic field around bit line 54a to magnify the magnetic field in the selected sense layer 86a and 86b. The cladding layer 68 also provides flux closure for the selected sense layer 86a and 86b. The magnetic fields combine to set or switch the orientation of magnetization in the selected sense layer 86a and 86b.

During a read operation, read/write circuit 44 selects one word line 52a and 52b and bit line 54a to sense the resistance through the memory cell 46 located at the cross-point of the selected word line 52a and 52b and the selected bit line 54a. The row circuit 48 selects one word line 52a and 52b, and the column circuit 50 selects bit line 54a. The row circuit 48 provides a voltage on the selected word line 52a and 52b and a sense current through the selected word line 52a and 52b and the selected memory cell stack 88a and 88b to the bit line 54a. The column circuit 5 senses the magnitude of the sense current that indicates the resistive state of the selected memory cell 46, i.e. the selected memory cell stack 88a and 88b. The read/write circuit 44 provides a logic level output signal to indicate the resistive state of the selected memory cell 46.

FIGS. 4–19 are diagrams illustrating an exemplary process for constructing the exemplary embodiment of array section 60 and magnetic memory 40. In the exemplary process, memory cells 46 are constructed in and on dielectric layer 72. The dielectric layer 72 can be formed on a substrate containing integrated circuitry, such as complimentary metal oxide semiconductor (CMOS) circuitry. The CMOS circuitry can include digital and analog circuits for magnetic memory 40, including read/write circuit 44.

Figure 4:
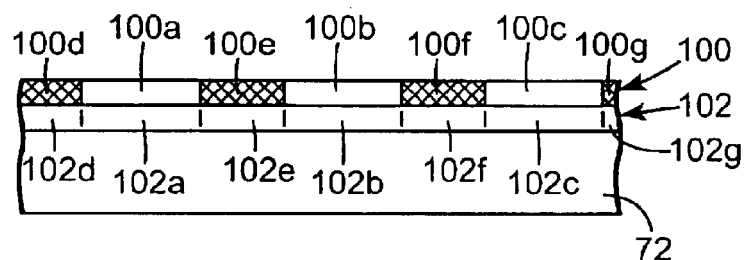
FIG. 4 is a diagram illustrating a cross-section of a trench mask positioned over a photoresist layer on a dielectric layer.

FIG. 4 is a diagram illustrating a cross-section of a trench mask 100 positioned over a photoresist layer 102 on dielectric layer 72. The photoresist layer 102 is formed on dielectric layer 72 and trench mask 100 is positioned over photoresist layer 102. In practice, trench mask 100 is spaced from photoresist layer 102.

The trench mask 100 includes clear portions 100a–100c and opaque portions 100d–100g. Light is focused through clear portions 100a–100c and onto photoresist layer 102 to form patterns in photoresist layer 102. The photoresist layer 102 includes exposed portions 102a–102c and unexposed portions 102d–102g.

In the exemplary embodiment, trench mask 100 includes clear portions 100a–100c and opaque portions 100d–100g to form parallel lines in photoresist layer 102. The photoresist layer 102 is exposed to high intensity ultra-violet (UV) light through clear portions 100a–10c to form exposed portions 102a–102c. The exposed portions 102a–102c define where trenches will be in dielectric layer 72. The exposed portions 102a–102c are removed to leave unexposed portions 102d–102g on dielectric layer 72.

In another process for constructing embodiments of the present invention, the negative of trench mask 100 can be used with a different photoresist material as the photoresist layer on dielectric 72. Exposed portions of the different photoresist material are cured and remain on dielectric layer 72. Unexposed portions of the different photoresist material are washed away to leave a photoresist pattern on dielectric layer 72 similar to the parallel line pattern of the exemplary embodiment.

Figure 5:
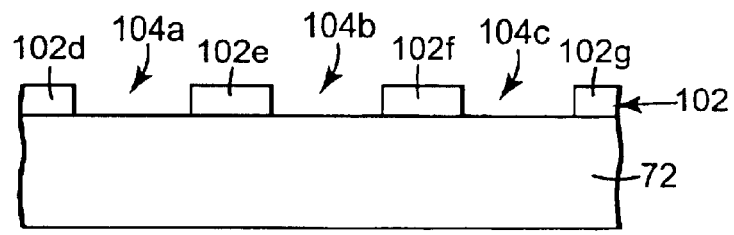
FIG. 5 is a diagram illustrating a cross-section of unexposed portions of a photoresist layer on a dielectric layer.

FIG. 5 is a diagram illustrating a cross-section of unexposed portions 102d–102g of photoresist layer 102 on dielectric layer 72. The exposed portions 102a–102c have been removed in a wash. The unexposed portions 102d–102g outline openings 104a–104c in photoresist layer 102. The openings 104a–104c and unexposed portions 102d–102g form a pattern on dielectric layer 72 that corresponds to the clear portion 100a–100c and opaque portion 100d–100g pattern of trench mask 100. In the exemplary embodiment the pattern includes straight, parallel lines that correspond to bit lines 54a–54c of magnetic memory 40. The dielectric layer 72 is etched through openings 104a–104c in photoresist layer 102 to form trenches 74 in dielectric layer 72.

Figure 6:
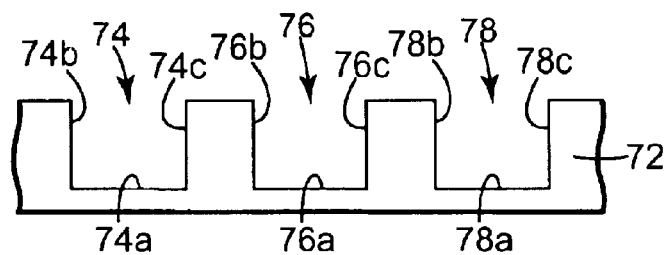
FIG. 6 is a diagram illustrating a cross-section of a dielectric layer including trenches.

FIG. 6 is a diagram illustrating a cross-section of dielectric layer 72 including trenches 74, 76 and 78. The trenches 74, 76 and 78 have side surfaces 74a–c, 76a–c and 78a–c.

The trenches 74, 76 and 78 are etched out of dielectric layer 72 in a reactive ion etch (RIE). The RIE removes the dielectric layer 72 through openings 104a–104c. The unexposed portions 102d–102g of photoresist layer 102 define the dimensions of trenches 74, 76 and 78. The unexposed portions 102d–102g are removed to leave dielectric layer 72 and trenches 74, 76 and 78. The trenches 74, 76 and 78 are patterned similar to the clear portions 100a–100c of trench mask 100.

Figure 7:
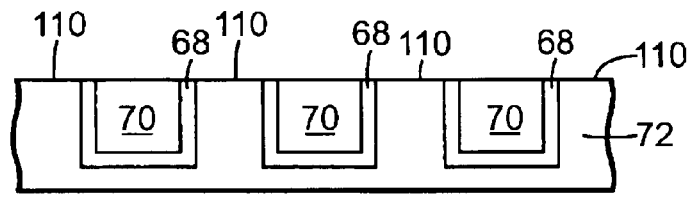
FIG. 7 is a diagram illustrating a cross-section of a dielectric layer including ferromagnetic cladding layers and conductors.

FIG. 7 is a diagram illustrating a cross-section of dielectric layer 72 including ferromagnetic cladding layers 68 and conductors 70. The cladding layers 68 are thin layers of magnetic material that line the trenches 74, 76 and 78 in dielectric layer 72. The conductors 70 fill the cladding layers 68 in trenches 74, 76 and 78. The conductors 70 are conductive material, such as copper. The cladding layers 68 include magnetic material with a higher permeability than the conductors 70.

The cladding layers 68 are formed as a single, blanket ferromagnetic cladding layer 68 over dielectric layer 72. The blanket cladding layer 68 is deposited on dielectric layer 72 to form a thin layer that covers top portions 110 and lines the trenches 74, 76 and 78 of dielectric layer 72. Processes such as sputtering, evaporation, ion beam deposition, chemical vapor deposition or atomic layer deposition can be used to deposit the cladding layers 68.

The conductors 70 are formed as a single, blanket conductor 70 over the blanket cladding layer 68. The blanket conductor 70 covers the blanket cladding layer 68 over the top portions 110. In addition, the blanket conductor 70 fills the blanket cladding layer 68 that lines the trenches 74, 76 and 78 in dielectric layer 72. Processes such as sputtering, evaporation, electrochemical plating, ion beam deposition, chemical vapor deposition or atomic layer deposition can be used to deposit the conductors 70.

The excess material including the blanket conductor 70 and blanket cladding layer 68 is removed from the top portions 110 of dielectric layer 72. Removing the excess material defines the dimensions of the cladding layers 68 and conductors 70 inside trenches 74, 76 and 78. The excess material is removed in a chemical mechanical polish (CMP). In another process, the excess material is removed in a RIE, dry etching process. In either situation, the top portions 110, cladding layers 68 and conductors 70 are substantially flat and uniform across the entire surface.

Figure 8:
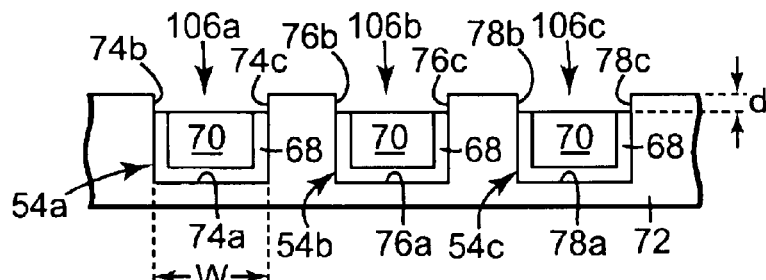
FIG. 8 is a diagram illustrating a cross-section of a dielectric layer and bit lines.

FIG. 8 is a diagram illustrating a cross-section of dielectric layer 72 and bit lines 54a–54c. The bit lines 54a–54c include cladding layers 68 and conductors 70. Recesses 106a–106c are formed in trenches 74, 76 and 78 to a depth d. The bit lines 54a–54c extend along the length of dielectric layer 72 in trenches 74, 76 and 78. The length and width W dimensions of bit lines 54a–54c are defined by trenches 74, 76 and 78.

The cladding layers 68 line the three side surfaces 74a–c, 76a–c and 78a–c of trenches 74, 76 and 78. In bit line 54a, cladding layer 68 lines side surface 74a and partially lines side surfaces 74b and 74c. In bit line 54b, cladding layer 68 lines side surface 76a and partially lines side surfaces 76b and 76c. In bit line 54c, cladding layer 68 lines side surface 78a and partially lines side surfaces 78b and 78c. The conductors 70 are disposed in cladding layers 68 to form cross-sections that are substantially rectangular.

The bit lines 54a–54c are formed by removing portions of cladding layers 68 and conductors 70 from within trenches 74, 76 and 78. Removing portions of the cladding layers 68 and conductors 70 creates recesses 106a–106c in dielectric layer 72 next to the remaining cladding layers 68 and conductors 70, i.e. above bit lines 54a–54c. Material from cladding layers 68 and conductors 70 are removed in a semiconductor processing step, such as an aggressive CMT, an ion etch or a wet chemical etch.

Figure 9:
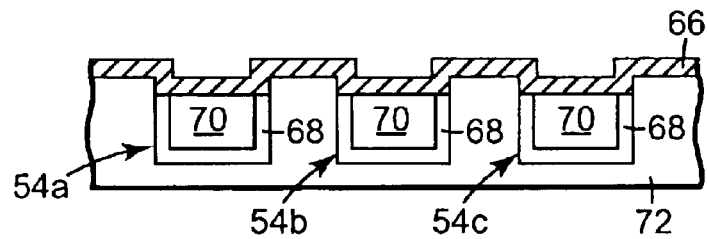
FIG. 9 is a diagram illustrating a cross-section of bit lines and a dielectric layer coated with a reference layer.

FIG. 9 is a diagram illustrating a cross-section of bit lines 54a–54c and dielectric layer 72 coated with reference layer 66. The bit lines 54a–54c include cladding layers 68 and conductors 70. The reference layer 66 is applied as a blanket reference layer 66 over dielectric layer 72 and in recesses 106a–106c over bit lines 54a–54c. The reference layer 66 has a pinned orientation of magnetization.

Figure 10:
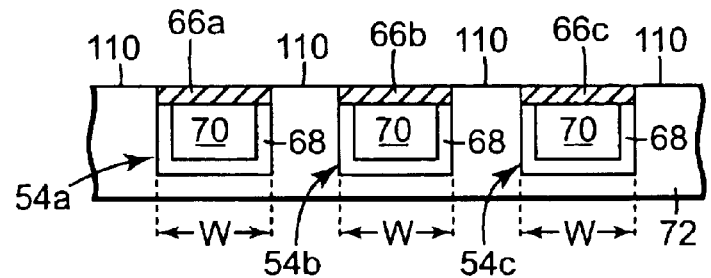
FIG. 10 is a diagram illustrating a cross-section of reference layers next to bit lines in a dielectric layer.

FIG. 10 is a diagram illustrating a cross-section of reference layers 66a–66c next to bit lines 54a–54c in dielectric layer 72. The bit lines 54a–54c include cladding layers 68 and conductors 70. The reference layers 66a–66c are formed in recesses 106a–106c and extend along the length of dielectric layer 72 in trenches 74, 76 and 78. The reference layers 66a–66c have pinned orientations of magnetization.

To form reference layers 66a–66c, excess material from the blanket reference layer 66 is removed from dielectric layer 72. The excess material is removed in a CMP to planarize the surface of dielectric layer 72 and the remaining reference layers 66a–66c. The top surface, including the top portions 110 and reference layers 66a–66c, is substantially flat and uniform across the entire surface. Removing the excess reference layer material, defines the reference layers 66a–66c in trenches 74, 76 and 78 of dielectric layer 72. The width dimensions W of the reference layers 66a–66c are defined by the sidewalls 74b and 74c, 76b and 76c, and 78b and 78c of trenches 74, 76 and 78. In other processes, the surface of dielectric layer 72 and the remaining reference layers 66a–66c can be planarized in other suitable steps, such as by RIE or ion milling processes.

Figure 11:
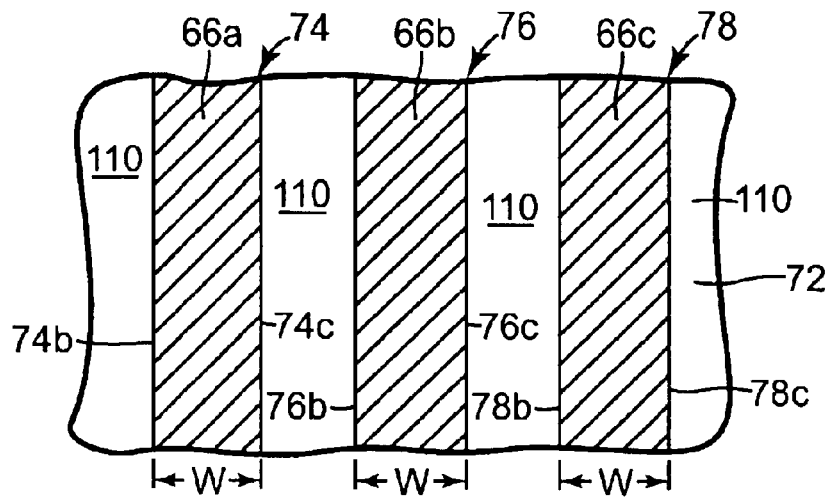
FIG. 11 is a diagram illustrating a top-view of reference layers in a dielectric layer.

FIG. 11 is a diagram illustrating a top-view of reference layers 66a–66c in dielectric layer 72. The reference layers 66a–66c extend along trenches 74, 76 and 78 and between top portions 110 of dielectric layer 72. The width dimensions W of reference layers 66a–66c are defined by sidewalls 74b and 74c, 76b and 76c and 78b and 78c of trenches 74, 76 and 78.

In another embodiment, a sacrificial layer is formed as a blanket layer over reference layer 66 to facilitate the CMP process. Reference layer 66 and the sacrificial layer are processed together, such that after the planarization step illustrated in FIG. 10, reference layers 66a, 66b and 66c have an additional layer of sacrificial material over them. The sacrificial layer prevents inadvertent removal of reference layer material from trenches 74, 76 and 78 during the CMP process. In order for the sacrificial layer to be effective, the thickness of reference layer 66 is less than the depth d of recesses 106a, 106b and 106c. The sacrificial layer is removed prior to deposition of a barrier layer 64. The sacrificial layer is removed by a process such as a RIE, ion etching, sputter etching or wet chemical etching. Additional cleaning of exposed reference layers 66a–66c may be done immediately prior to barrier layer deposition. If a sacrificial layer is used, the top surfaces of reference layers 66a–66c are not precisely planar with the surface of dielectric layer 72.

Figure 12:
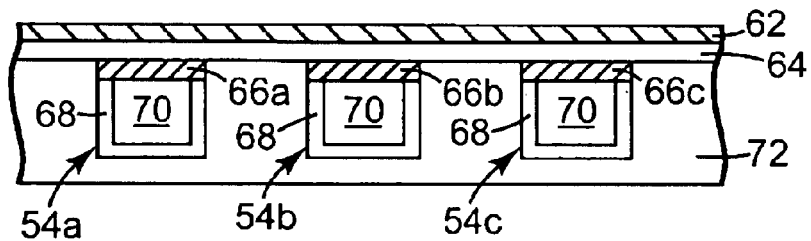
FIG. 12 is a diagram illustrating a cross-section of reference layers and a dielectric layer coated with a barrier layer and a sense layer.

FIG. 12 is a diagram illustrating a cross-section of reference layers 66a–66c and dielectric layer 72 coated with barrier layer 64 and sense layer 62. Bit lines 54a–54c in dielectric layer 72 include cladding layers 68 and conductors 70. The barrier layer 64 is an insulating barrier layer through which electrical charge tunnels during a read operation. The sense layer 62 has an orientation of magnetization that is alterable.

The barrier layer 64 is deposited on the planar top surface of dielectric layer 72 and reference layer 66a–66c as a blanket barrier layer 64 deposited in a plane. The sense layer 62 is deposited on the planar barrier layer 64 as a blanket sense layer 62 deposited in a plane. Cleaning processes, such as ion etching or sputter etching may be employed prior to coating barrier layer 64.

Figure 13:
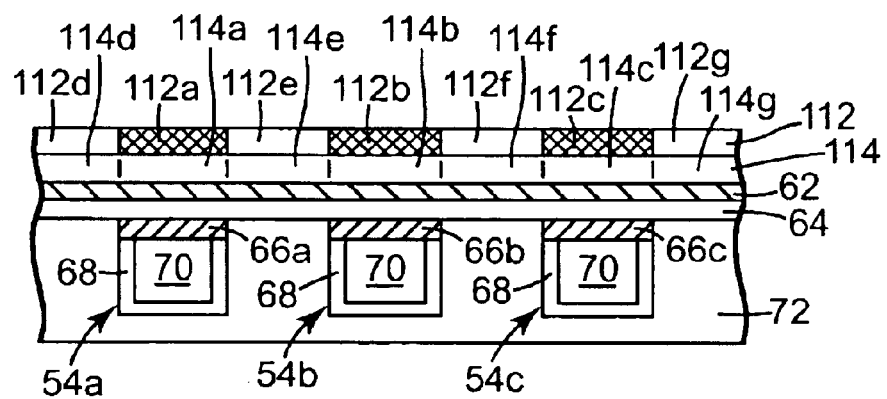
FIG. 13 is a diagram illustrating a cross-section of a bit mask positioned over a photoresist layer on a sense layer.

FIG. 13 is a diagram illustrating across-section of a bit mask 112 positioned over a photoresist layer 114 on sense layer 62. The sense layer 62 is situated on barrier layer 64 that is located on the planar surface of dielectric layer 72 and reference layers 66a–66c. Bit lines 54a–54c include cladding layers 68 and conductors 70.

The photoresist layer 114 is formed in a deposit on sense layer 62. Bit mask 112 is positioned over photoresist layer 114. In practice, bit mask 112 is spaced from photoresist layer 114. The bit mask 112 includes opaque portions 112a–112c and clear portions 112d–112g. Light is focused through the clear portions 112d–112g of bit mask 112 and onto photoresist layer 114 to form patterns in photoresist layer 114. The photoresist layer 114 includes unexposed portions 114a–114c and exposed portions 114d–114g.

In the exemplary embodiment, bit mask 112 includes opaque portions 112a–112c and clear portions 112d–112g to form rectangular (or oblong) bits in photoresist layer 114 and eventually sense layer 62. The bit mask 112 is aligned to locate the opaque portions 112a–112c over reference layers 66a–66c. The photoresist layer 114 is exposed to high intensity ultra-violet (UV) light through clear portions 112d–112g to form exposed portions 14d–114g in photoresist layer 114. The exposed portions 114d–114g are removed to leave the unexposed portions 114a–114c on sense layer 62.

In another process, the negative of bit mask 112 can be used with a different photoresist material as the photoresist layer on sense layer 62. Exposed portions of the different photoresist material are cured and remain on sense layer 62. Unexposed portions of the different photoresist material are washed away to leave a photoresist pattern on sense layer 62 similar to the sense bit pattern of the exemplary embodiment.

Figure 14:
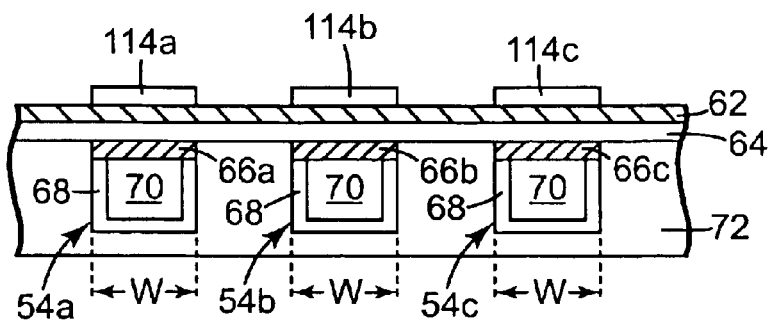
FIG. 14 is a diagram illustrating a cross-section of unexposed portions of a photoresist layer on a sense layer.

FIG. 14 is a diagram illustrating a cross-section of unexposed portions 114a–114c of photoresist layer 114 on sense layer 62. The sense layer 62 is located on barrier layer 64 that is on the planar surface of dielectric layer 72 and reference layers 66a–66c. The bit lines 54a–54c include cladding layers 68 and conductors 70.

The unexposed portions 114a–114c will define the dimensions of the sense layer bits in sense layer 62. The exposed portions 114d–114g are washed away to leave the unexposed portions 114a–114c on sense layer 62. The unexposed portions 114a–114c are rectangular in shape to form rectangular sense layer bits on barrier layer 64. The unexposed portions 114a–114c are aligned with the width W of bit lines 54a–54c and reference layers 66a–66c.

Figure 15:
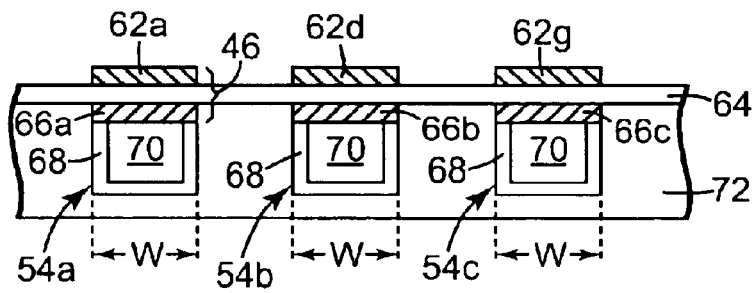
FIG. 15 is a diagram illustrating a cross-section of sense layers on a barrier layer.

FIG. 15 is a diagram illustrating a cross-section of sense layers 62a, 62d and 62g on barrier layer 64. The barrier layer 64 is located on the planar surface of dielectric layer 72 and reference layers 66a–66c. Bit lines 54a–54c include cladding layers 68 and conductors 70.

The sense layer 62a, 62d and 62g are formed on barrier layer 64 by removing sense layer material from the blanket sense layer 62. The sense layer material is removed from between the unexposed portions 114a–114c. The sense layer material is removed in a process, such as an ion etch, RIE or a wet chemical etch. The unexposed portions 114a–114c are removed to leave sense layers 62a, 62d and 62g.

The sense layers 62a, 62d and 62g are aligned with the width dimension W of bit lines 54a–54c and reference layers 66a–66c. The sense layers 62a, 62d and 62g are rectangular sense layer bits that are each part of a memory cell 46. A memory cell 46 comprises one sense layer bit, barrier layer 64 and the corresponding reference layer line. For example, a memory cell 46 comprises sense layer 62a, barrier layer 64 and reference layer 66a.

Figure 16:
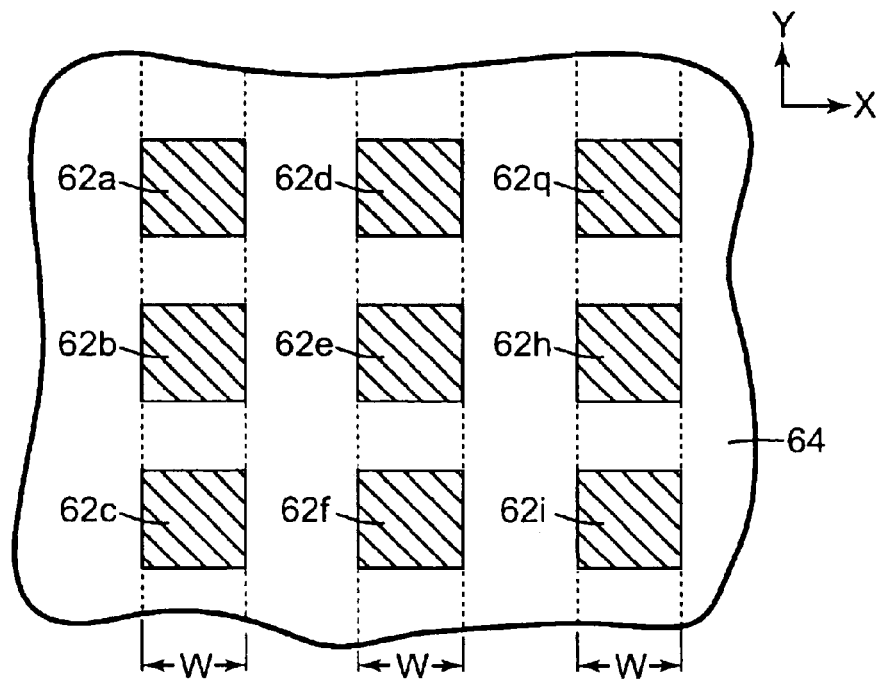
FIG. 16 is a diagram illustrating a top-view of sense layers on a barrier layer.

FIG. 16 is a diagram illustrating a top-view of sense layers 62a–62i on barrier layer 64. The sense layers 62a–62i are arranged in rows and columns, with the rows extending along an x-direction and the columns extending along a y-direction. The columns of sense layers 62a–62i are formed to align with the width dimension W of bit lines 54a–54c and reference layers 66a–66c. Each sense layer 62a–62i is part of a memory cell 46 in array 42.

Figure 17:
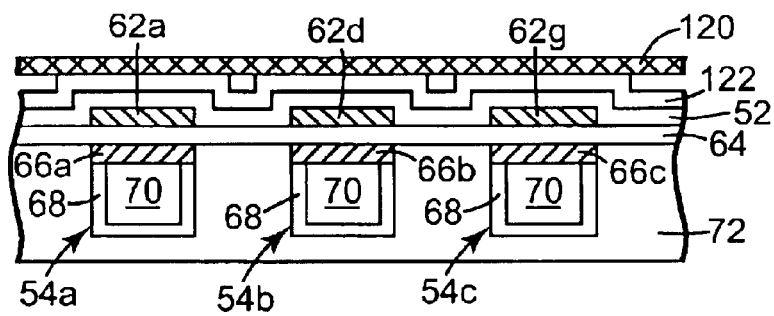
FIG. 17 is a diagram illustrating a cross-section of a word line mask positioned over a photoresist layer and a conductive layer.

FIG. 17 is a diagram illustrating a cross-section of a word line mask 120 positioned over a photoresist layer 122 and a conductive layer 52. The conductive layer 52 is formed on barrier layer 64 and sense layers 62a–62i. The photoresist layer 122 is formed on the conductive layer 52 and is located between the conductive layer 52 and word line mask 120. In practice, the word line mask 120 is spaced from photoresist layer 122. The word line mask 120 includes a pattern for etching conductive layer 52.

The sense layers 62a, 62d and 62g are located between the conductive layer 52 and barrier layer 64. The barrier layer 64 is located on the planar surface of dielectric layer 72 and reference layers 66a–66c. The bit lines 54a–54c are next to reference layers 66a–66c in dielectric layer 72 and include cladding layers 68 and conductors 70.

The conductive layer 52 is formed as a blanket conductive layer 52 over the barrier layer 64 and sense layers 62a–62i. The blanket conductive layer 52 is etched to form word lines 52a–52c across array 42. The word lines 52a–52c cross bit lines 54a–54c at memory cells 46, including sense layers 62a–62i. The word lines 52a–52c are orthogonal to bit lines 54a–54c.

The photoresist layer 122 is formed on conductive layer 52 as a blanket photoresist layer 122. The photoresist layer 122 is patterned using the word line mask 120 to form word lines 52a–52c in conductive layer 52.

Figure 18:
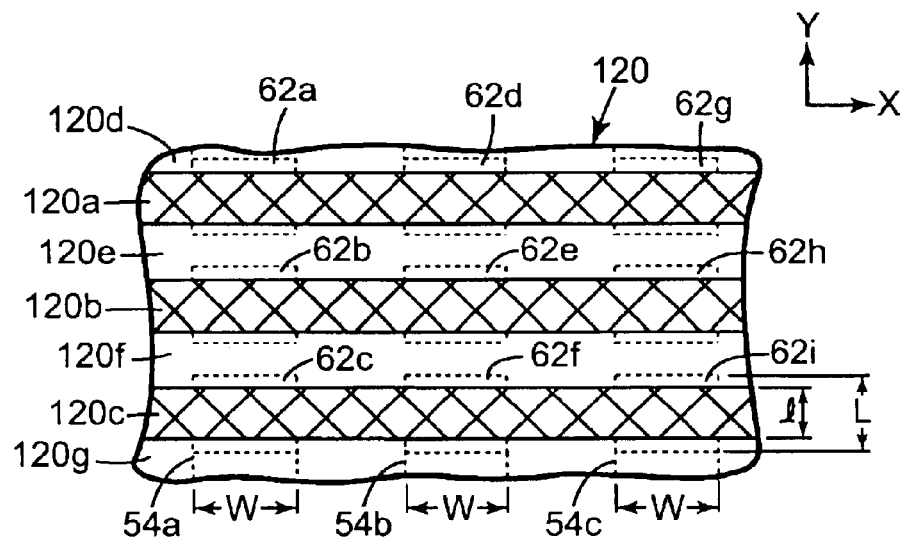
FIG. 18 is a diagram illustrating a top-view of a word line mask over a photoresist layer.

FIG. 18 is a diagram illustrating a top-view of word line mask 120 over photoresist layer 122. The word line mask 120 includes opaque portions 120a–120c and clear portions 120d–120g. The opaque portions 120a–120c extend along the x-direction and are aligned over sense layers, indicated at 62a–62i. The opaque portions 120a–120c are orthogonal to bit lines, indicated at 54a–54c, having width dimensions W. The opaque portions 120a–120c are narrower at length l as compared to length L of sense layers 62a–62i. Word lines 52a–52c formed from word line mask 120 and opaque portions 120a–120c are narrower than sense layers 62a–62i. The narrower word lines 52a–52c do not overlap sense layer 62a–62i at length L to lie on barrier layer 64 above reference layers 66a–66c.

The photoresist layer 122 is exposed to high intensity UV light through the clear portions 120d–120g of word line mask 120. The exposed portions of the photoresist layer 122 are washed away to leave the unexposed portions of the photoresist layer 122, under the opaque portions 120a–120c of word line mask 120. The conductive layer 52 is removed from between the unexposed portions of the photoresist layer 122 to define word lines 52a–52c under the unexposed layer of photoresist layer 122.

In another process, the negative of word line mask 120 can be used with a different photoresist material as the photoresist layer on conductive layer 52. Exposed portions of the different photoresist material are cured and remain on conductive layer 52. Unexposed portions of the different photoresist material are washed away to leave a photoresist pattern on conductive layer 52 similar to the word line pattern of the exemplary embodiment.

In another embodiment, sense layer 62 is patterned into lines along the lengths of trenches 74, 76 and 78 and over reference layers 66a–66c. The word line mask 120 is used to pattern the sense layer lines into memory cell sense layers and the second conductor into word lines that are not narrower than the memory cell sense layers.

Figure 19:
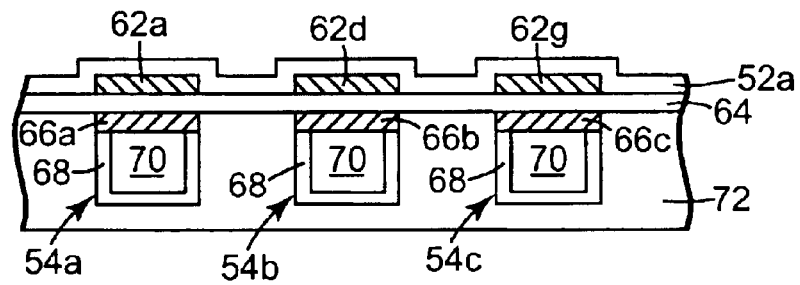
FIG. 19 is a diagram illustrating a cross-section of a word line crossing sense layers.

FIG. 19 is a diagram illustrating a cross-section of word line 52a crossing sense layers 62a, 62d and 62g. The sense layers 62a, 62d and 62g are located on barrier layer 64 that is on the planar surface of dielectric layer 72 and reference layers 66a–66c. The bit lines 54a–54c are located next to reference layers 66a–66c in dielectric layer 72 and include cladding layers 68 and conductors 70. The word line 52a is located on barrier layer 64 and across sense layer 62a, 62d and 62g. The word line 52a is not on barrier layer 64 directly over reference layers 66a–66c. FIG. 2 is another diagram illustrating the embodiment illustrated in FIG. 19.

FIGS. 4–8 and 20–26 are diagrams illustrating a process for constructing the embodiment of array section 80, illustrated in FIG. 3. The process begins similar to the previously described process and proceeds, as illustrated in FIGS. 4–8, to construct recesses 106a–106c over bit lines 54a–54c in dielectric layer 72. The recesses 106a–106c are formed in trenches 74, 76 and 78 of dielectric layer 72.

Figure 20:
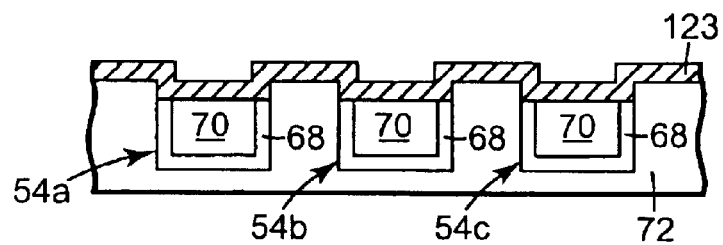
FIG. 20 is a diagram illustrating a cross-section of bit lines and a dielectric layer coated with a sense layer.

FIG. 20 is a diagram illustrating a cross-section of bit lines 54a–54c and dielectric layer 72 coated with a sense layer 123. The bit lines 54a–54c include cladding layers 68 and conductors 70. The sense layer 123 is formed as a blanket sense layer 123 over dielectric layer 72 and in recesses 106a–106c over bit lines 54a–54c. The sense layer 123 has an alterable orientation of magnetization.

Figure 21:
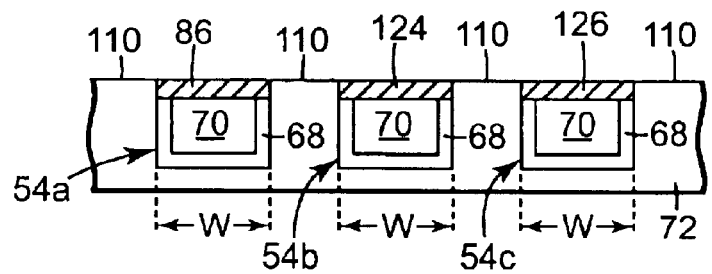
FIG. 21 is a diagram illustrating a cross-section of sense layers next to bit lines in a dielectric layer.

FIG. 21 is a diagram illustrating a cross-section of sense layers 86, 124 and 126 next to bit lines 54a–54c in dielectric layer 72. The bit lines 54a–54c include cladding layers 68 and conductors 70. The sense layers 86, 124 and 126 are formed in recesses 106a–106c and extend along the length of dielectric layer 72 in trenches 74, 76 and 78. The sense layers 86, 124 and 126 have alterable orientations of magnetization.

To form sense layers 86, 124 and 126, the excess material from blanket sense layer 123 is removed from top portions 110 of dielectric layer 72. The excess material is removed in a CMP to planarize the surface of dielectric layer 72 and the remaining sense layers 86, 124 and 126. The top surface, including top portions 110 and sense layers 86, 124 and 126, is substantially flat and uniform across the entire surface. Removing the excess sense layer material, defines the sense layers 86, 124 and 126 in trenches 74, 76 and 78 of dielectric layer 72. The width dimensions W of sense layers 86, 124 and 126 are defined by trenches 74, 76 and 78.

Figure 22:
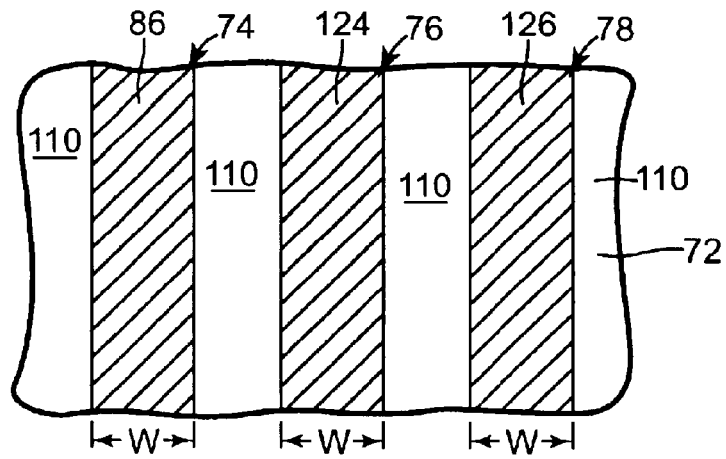
FIG. 22 is a diagram illustrating a top-view of sense layers in a dielectric layer.

FIG. 22 is a diagram illustrating a top-view of sense layers 86, 124 and 126 in dielectric layer 72. The sense layers 86, 124 and 126 extend along trenches 74, 76 and 78 in dielectric layer 72 and between top portions 110 of dielectric layer 72. The width dimensions W of sense layers 86, 124 and 126 are defined by trenches 74, 76 and 78.

In another embodiment, a sacrificial layer is formed as a blanket layer over sense layer 123 to facilitate the CMP process. Sense layer 123 and the sacrificial layer are processed together, such that after the planarization step illustrated in FIG. 21, sense layers 86, 124 and 126 have an additional layer of sacrificial material over them. The sacrificial layer prevents inadvertent removal of sense layer material from trenches 74, 76 and 78 during the CMP process. In order for the sacrificial layer to be effective, the thickness of sense layer 123 is less than the depth d of recesses 106a, 106b and 106c. The sacrificial layer is removed prior to deposition of a barrier layer 84. The sacrificial layer is removed by a process such as a RIE, ion etching, sputter etching or wet chemical etching. Additional cleaning of exposed sense layers 86, 124 and 126 may be done immediately prior to barrier layer deposition. If a sacrificial layer is used, the top surfaces of sense layers 86, 124 and 126 are not precisely planar with the surface of dielectric layer 72.

Figure 23:
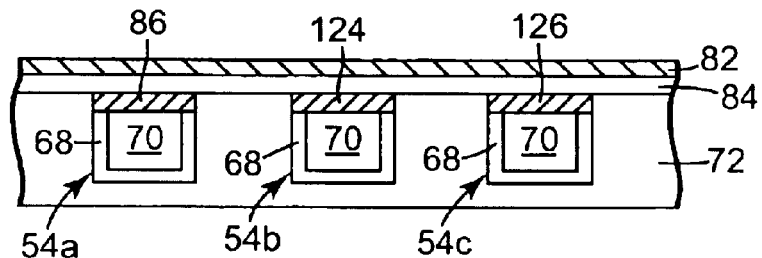
FIG. 23 is a diagram illustrating a cross-section of sense layers and a dielectric layer coated with a barrier layer and a reference layer.

FIG. 23 is a diagram illustrating a cross-section of sense layers 86, 124 and 126 and dielectric layer 72 coated with barrier layer 84 and reference layer 82. Bit lines 54a–54c in dielectric layer 72 include cladding layers 68 and conductors 70. The barrier layer 84 is an insulating barrier layer through which electrical charge tunnels during a read operation. The reference layer 82 has a pinned orientation of magnetization.

The barrier layer 84 is deposited on the planar top surface of dielectric layer 72 and sense layers 86, 124 and 126. The barrier layer 84 is a blanket barrier layer 84 deposited in a plane. The reference layer 82 is deposited on the planar barrier layer 84. The reference layer 82 is a blanket reference layer 82 deposited in a plane.

Figure 24:
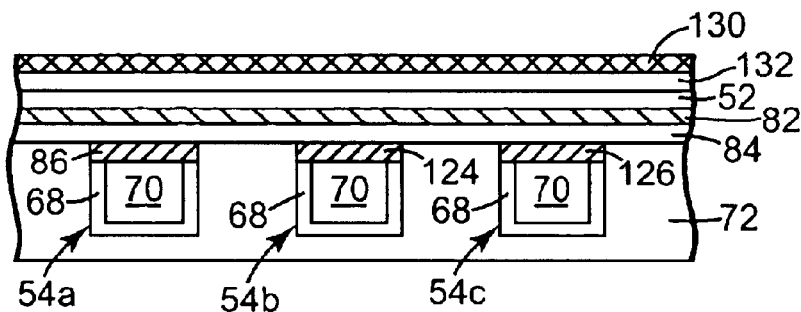
FIG. 24 is a diagram illustrating a cross-section of a word line mask positioned over a photoresist layer that is next to a conductive layer.

FIG. 24 is a diagram illustrating a cross-section of a word line mask 130 positioned over a photoresist layer 132 that is next to conductive layer 52. The conductive layer 52 is formed on reference layer 82, and photoresist layer 132 is formed on conductive layer 52. The photoresist layer 132 is located between conductive layer 52 and word line mask 130. In practice, word line mask 130 is spaced from photoresist layer 132. The word line mask 130 includes a pattern for etching the conductive layer 52 to form word lines 52a–52c.

The reference layer 82 is located between conductive layer 52 and barrier layer 84. The barrier layer 84 is located on the planar surface of dielectric layer 72 and sense layers 86, 124 and 126. Bit lines 54a–54c are next to sense layers 86, 124 and 126 in dielectric layer 72 and include cladding layers 68 and conductors 70.

The conductive layer 52 is formed as a blanket conductive layer 52 over reference layer 82. The blanket conductive layer 52, blanket reference layer 82, blanket barrier layer 84 and sense layer lines 86, 124 and 126 are etched in a single etching process using word line mask 130. The blanket conductive layer 52 is etched to form word lines 52a–52c across array 42. The blanket reference layer 82 is etched to form reference layers and the blanket barrier layer 84 is etched to form barrier layers that correspond to word lines 52a–52c. The sense layer lines 86, 124 and 126 are etched to form sense layer bits. The word lines 52a–52c and the corresponding reference layers and barrier layers cross bit lines 54a–54c at memory cells 46, including sense layer bits such as sense layers 86a and 86b illustrated in FIG. 3.

As illustrated in FIG. 3, word line 52a is next to reference layer 82a that is next to barrier layer 84a The word line 52a, reference layer 82a and barrier layer 84a cross sense layer 86a and bit line 54a. The reference layer 82a, barrier layer 84a and sense layer 86a make up a memory cell 46. The word line 52b, reference layer 82b and barrier layer 84b cross sense layer 86b and bit line 54a. The reference layer 82b, barrier layer 84b and sense layer 86b make up a second memory cell 46. The sense layer material from sense layer line 86 previously located on each side of word lines 52a and 52b is removed during the etching process to form sense layers 86a and 86b.

The photoresist layer 132 is formed on conductive layer 52 as a blanket photoresist layer 132. The photoresist layer 132 is patterned using word line mask 130 to form word lines 52a–52c in conductive layer 52 and to pattern the reference layer 82, barrier layer 84 and sense layer lines 86, 124, and 126.

Figure 25:
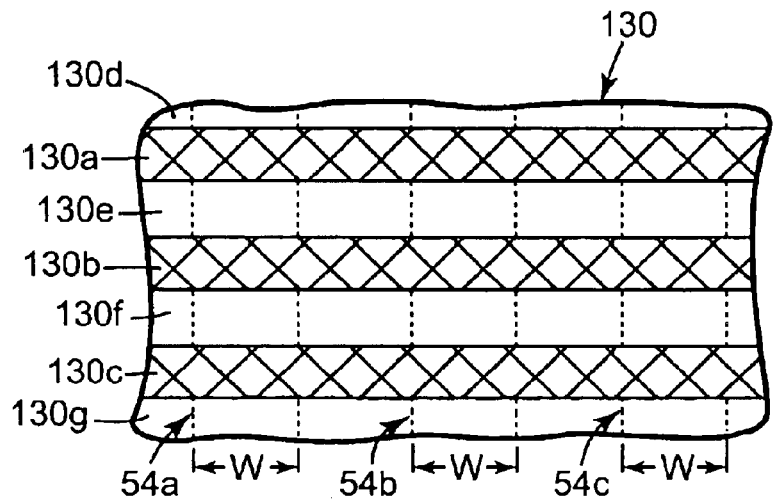
FIG. 25 is a diagram illustrating a top-view of a word line mask over a photoresist layer.

FIG. 25 is a diagram illustrating a top-view of word line mask 130 over photoresist layer 132. The word line mask 130 includes opaque portions 130a–130c and clear portions 130d–130g. The opaque portions 130a–130c extend along the x-direction and are aligned orthogonal to bit lines, indicated at 54a–54c. The bit lines 54a–54c have width dimensions W.

The photoresist layer 132 is exposed to high intensity UV light through the clear portions 130d–130g of word line mask 130. The exposed portions of the photoresist layer 132 are washed away to leave the unexposed portions of the photoresist layer 132. The unexposed portions of the photoresist layer 132 are the portions situated under the opaque portions 130a–130c of word line mask 130. The conductive layer 52, reference layer 82, barrier layer 84 and sense layer lines 86, 124 and 126 are removed from between the unexposed portions of photoresist layer 132 to define word lines 52a–52c and sense layer bits, such as sense layers 86a and 86b illustrated in FIG. 3.

In another process, the negative of word line mask 130 can be used with a different photoresist material as the photoresist layer on conductive layer 52. Exposed portions of the different photoresist material are cured and remain on conductive layer 52. Unexposed portions of the different photoresist material are washed away to leave a photoresist pattern on conductive layer 52 similar to the word line pattern.

Figure 26:
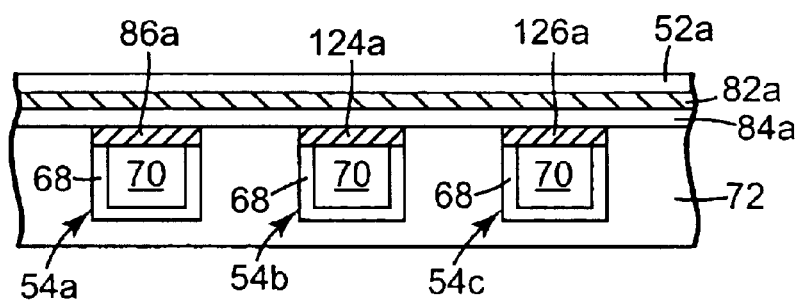
FIG. 26 is a diagram illustrating a cross-section of a word line, a reference layer and a barrier layer crossing sense layers.

FIG. 26 is a diagram illustrating a cross-section of word line 52a, reference layer 82a and barrier layer 84a crossing sense layers 86a, 124a and 126a The reference layer 82a is located between word line 52a and barrier layer 84a. The barrier layer 84a is located between reference layer 82a and the planar top surface of dielectric layer 72 and sense layers 86a, 124a and 126a. The sense layers 86a, 124a and 126a are located in trenches 74, 76 and 78 of dielectric layer 72 and next to bit lines 54a–54c. The sense layer 86a is located between the barrier layer 84a and bit line 54a. The sense layer 124a is located between the barrier layer 84a and bit line 54, and the sense layer 126a is located between the barrier layer 84a and bit line 54c. The bits lines 54a–54c include cladding layers 68 and conductors 70. FIG. 3 is another diagram illustrating the embodiment illustrated in FIG. 26.

What is claimed is:

1. A magnetic memory comprising:
   an insulator having a trench;
   a first conductor in the trench;
   a first magnetic layer in the trench and adjacent to the first conductor; and
   a second magnetic layer outside the trench.

2. The magnetic memory of claim 1, comprising a barrier layer outside the trench and disposed between the first magnetic layer and the second magnetic layer.

3. The magnetic memory of claim 1, comprising a barrier layer that prevents shorts between the first magnetic layer and the second magnetic layer.

4. The magnetic memory of claim 1, where the first magnetic layer is self-aligned with the first conductor along at least one dimension of the trench.

5. The magnetic memory of claim 1, where the first magnetic layer comprises a reference layer.

6. The magnetic memory of claim 1, where the second magnetic layer is patterned into bits aligned with the first magnetic layer.

7. The magnetic memory of claim 1, comprising a second conductor disposed over the second magnetic layer, where the second conductor is narrower than the second magnetic layer.

8. The magnetic memory of claim 1, comprising a second conductor disposed over the second magnetic layer, where the second conductor is patterned into lines and the first magnetic layer is patterned into bits with a line mask pattern.

9. The magnetic memory of claim 1, comprising a second conductor disposed over the second magnetic layer and a barrier layer disposed between the first magnetic layer and the second magnetic layer, where the second conductor and the second magnetic layer are patterned the same.

10. The magnetic memory of claim 1, where the first magnetic layer comprises a sense layer.

11. The magnetic memory of claim 1, where the first conductor comprises:
a ferromagnetic cladding layer lining the trench; and
copper.

12. A magnetic memory comprising:
an array of memory cells;
first conductive lines;
second conductive lines crossing the first conductive lines at memory cells in the array of memory cells, where a memory cell in the array of memory cells comprises:
a first magnetic layer inside an insulating recess;
a second magnetic layer outside the insulating recess; and
a barrier layer between the first magnetic layer and the second magnetic layer.

13. The magnetic memory of claim 12, where the barrier layer is in a plane over the insulating recess.

14. The magnetic memory of claim 12, where the first conductive lines are in parallel insulating trenches formed in an insulator.

15. The magnetic memory of claim 12, where the array of memory cells is a three dimensional macro-array.

16. The magnetic memory of claim 12, comprising a write circuit configured to provide write currents to set memory cell states and a read circuit configured to provide a sense voltage and a sense current to read memory cell states.

17. The magnetic memory of claim 12, where the first magnetic layer crosses a plurality of memory cells.

18. A magnetic memory comprising:
means for self-aligning at least one dimension of a magnetic layer with a conductor in a dielectric; and
means for supporting a planar barrier layer adjacent to the magnetic layer and the dielectric layer.

19. The magnetic memory of claim 18, where the means for self-aligning comprises side surfaces of a trench in the dielectric.

20. The magnetic memory of claim 18, where the means for supporting a planar barrier layer comprises the magnetic layer and the dielectric planarized to a planar surface.

21. A magnetic memory cell comprising:
a first magnetic layer in a recess in a dielectric;
a barrier layer formed in a plane on the first magnetic layer and the dielectric; and
a second magnetic layer formed on the barrier layer.

22. The magnetic memory cell of claim 21, where the first magnetic layer is a sense layer and the second magnetic layer is a reference layer.

23. The magnetic memory cell of claim 21, where the first magnetic layer is a reference layer and the second magnetic layer is a sense layer.

* * * * *